United States Patent
Ogasawara et al.

(10) Patent No.: US 9,006,113 B2
(45) Date of Patent: Apr. 14, 2015

(54) GLASS COMPOSITION FOR PROTECTING SEMICONDUCTOR JUNCTION, METHOD OF MANUFACTURING SEMICONDUCTOR DEVICE AND SEMICONDUCTOR DEVICE

(75) Inventors: Atsushi Ogasawara, Hanno (JP); Kazuhiko Ito, Hanno (JP); Koji Ito, Hanno (JP)

(73) Assignee: Shindengen Electric Manufacturing Co. Ltd., Tokyo (JP)

( * ) Notice: Subject to any disclaimer, the term of this patent is extended or adjusted under 35 U.S.C. 154(b) by 0 days.

(21) Appl. No.: 13/811,447

(22) PCT Filed: Aug. 29, 2011

(86) PCT No.: PCT/JP2011/069448
§ 371 (c)(1),
(2), (4) Date: Jan. 22, 2013

(87) PCT Pub. No.: WO2013/030922
PCT Pub. Date: Mar. 7, 2013

(65) Prior Publication Data
US 2013/0154064 A1 Jun. 20, 2013

(51) Int. Cl.
| | |
|---|---|
| H01L 21/469 | (2006.01) |
| H01L 29/06 | (2006.01) |
| C03C 3/066 | (2006.01) |
| C03C 3/087 | (2006.01) |
| C03C 8/02 | (2006.01) |
| C03C 8/24 | (2006.01) |
| H01L 21/02 | (2006.01) |
| H01L 21/761 | (2006.01) |
| H01L 21/288 | (2006.01) |

(52) U.S. Cl.
CPC ............ *H01L 29/0603* (2013.01); *C03C 3/066* (2013.01); *C03C 3/087* (2013.01); *C03C 8/02* (2013.01); *C03C 8/24* (2013.01); *H01L 21/02172* (2013.01); *H01L 21/761* (2013.01); *H01L 21/2885* (2013.01)

(58) Field of Classification Search
CPC .............. C03C 4/16; C03C 3/00; C03C 3/04; H01L 29/0603
USPC ........................................................ 438/778
See application file for complete search history.

(56) References Cited

U.S. PATENT DOCUMENTS

| | | | |
|---|---|---|---|
| 6,214,699 B1* | 4/2001 | Joyner | 438/445 |
| 2005/0031837 A1* | 2/2005 | Cho et al. | 428/210 |

(Continued)

FOREIGN PATENT DOCUMENTS

| | | |
|---|---|---|
| JP | 5240071 A | 3/1977 |
| JP | 5393783 A | 8/1978 |
| JP | 5526656 A | 2/1980 |

(Continued)

OTHER PUBLICATIONS

International Search Report for PCT/JP2011/069448, dated Aug. 29, 2011.

*Primary Examiner* — Matthew Reames
(74) *Attorney, Agent, or Firm* — Lowe Hauptman & Ham, LLP

(57) ABSTRACT

A glass composition for protecting a semiconductor junction contains at least $SiO_2$, $Al_2O_3$, MO, and nickel oxide, and substantially contains none of Pb, P, As, Sb, Li, Na and K (M in MO indicates one of alkali earth metals).

7 Claims, 8 Drawing Sheets

(56) References Cited

U.S. PATENT DOCUMENTS

2007/0009744 A1    1/2007   Besinger et al.
2007/0154713 A1*   7/2007   Rosenflanz et al. .......... 428/408

FOREIGN PATENT DOCUMENTS

| | | |
|---|---|---|
| JP | 57-202742 A | 12/1982 |
| JP | 59-174544 A | 10/1984 |
| JP | 1186629 A | 7/1989 |
| JP | 2163938 A | 6/1990 |
| JP | 2004-087955 A | 3/2004 |
| JP | 2007-019503 A | 1/2007 |
| JP | 2010-076993 A | 4/2010 |
| WO | 2011093177 A1 | 8/2011 |

* cited by examiner

|  |  | example 1 | reference example 1 | example 2 | reference example 2 | reference example 3 | reference example 4 |
|---|---|---|---|---|---|---|---|
| composition ratio(mol %) | $SiO_2$ | 62.6 | 63.2 | 39.6 | 40 | 75 | 12 |
|  | $Al_2O_3$ | 15.3 | 15.5 | 10.9 | 11 | 5 | 0 |
|  | CaO | 5.5 | 5.6 | 18.8 | 19 | 0 | 0 |
|  | MgO | 15.6 | 15.7 | 0 | 0 | 0 | 0 |
|  | ZnO | 0 | 0 | 22.8 | 23 | 0 | 58 |
|  | $B_2O_3$ | 0 | 0 | 6.9 | 7 | 0 | 29 |
|  | NiO | 1 | 0 | 1 | 0 | 0 | 0 |
|  | PbO | 0 | 0 | 0 | 0 | 20 | 0 |
|  | balance | 0 | 0 | 0 | 0 | 0 | 1 |
|  | total | 100 | 100 | 100 | 100 | 100 | 100 |
| evaluation aspect | evaluation aspect 1 (environmental burden) | good | good | good | good | bad | good |
|  | evaluation aspect 2 (baking temperature) | good | good | good | good | good | good |
|  | evaluation aspect 3 (resistance to chemicals) | good | good | good | good | good | bad |
|  | evaluation aspect 4 (thermal expansion coefficient) | good | good | good | good | good | good |
|  | evaluation aspect 5 (insulation property) | good | good | good | good | good | good |
|  | evaluation aspect 6 (generation of bubbles) | good | fair | good | fair | good | good |
| comprehensive evaluation |  | good | fair | good | fair | bad | bad |

FIG.5

FIG.6A
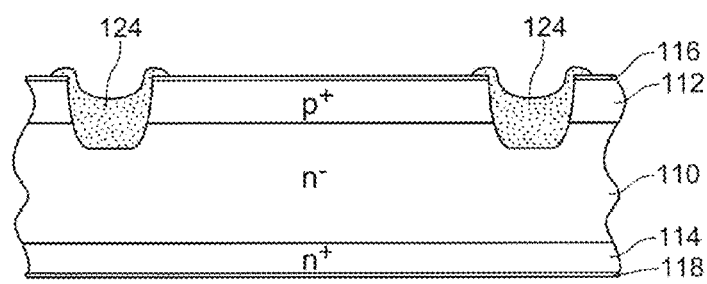
FIG.6B
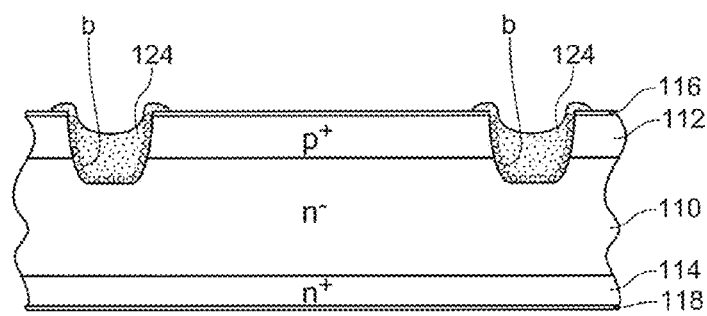
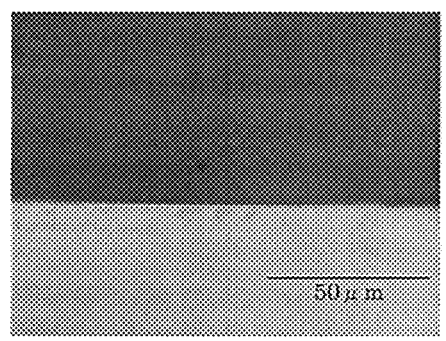
FIG.7A
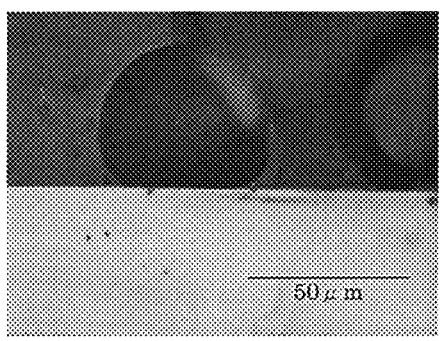
FIG.7B

GLASS COMPOSITION FOR PROTECTING SEMICONDUCTOR JUNCTION, METHOD OF MANUFACTURING SEMICONDUCTOR DEVICE AND SEMICONDUCTOR DEVICE

RELATED APPLICATIONS

The present application is a National Phase of International Application Number PCT/JP2011/069448, filed Aug. 29, 2011.

TECHNICAL FIELD

The present invention relates to a glass composition for protecting a semiconductor junction, a method of manufacturing a semiconductor device and a semiconductor device.

BACKGROUND ART

There has been known a method of manufacturing a semiconductor device where a glass layer for passivation is formed such that the glass layer covers a pn junction exposure portion in a process of manufacturing a mesa semiconductor device (see patent document 1, for example).

FIG. 8(a) to FIG. 8(d) and FIG. 9(a) to FIG. 9(d) are views for explaining such a conventional method of manufacturing a semiconductor device. That is, FIG. 8(a) to FIG. 8(d) and FIG. 9(a) to FIG. 9(d) are views showing respective steps of the conventional method.

The conventional method of manufacturing a semiconductor device includes, as shown in FIG. 8(a) to FIG. 8(d) and FIG. 9(a) to FIG. 9(d), "semiconductor substrate forming step", "trench forming step", "glass layer forming step", "photoresist forming step", "oxide film removing step", "roughened surface region forming step", "electrode forming step", and "semiconductor substrate cutting step" in this order. Hereinafter, the conventional method of manufacturing a semiconductor device is explained in order of steps.

(a) Semiconductor Substrate Forming Step

Firstly, a $p^+$ type diffusion layer 912 is formed by diffusion of a p type impurity from one surface of an $n^-$ type semiconductor substrate ($n^-$ type silicon substrate) 910, and an $n^+$ type diffusion layer 914 is formed by diffusion of an n type impurity from the other surface of the $n^-$ type semiconductor substrate 910 thus forming a semiconductor substrate in which a pn junction arranged parallel to a main surface of the semiconductor substrate is formed. Thereafter, oxide films 916, 918 are formed by thermal oxidation on a surface of the $p^+$ type diffusion layer 912 and a surface of the $n^+$ type diffusion layer 914 respectively (see FIG. 8(a)).

(b) Trench Forming Step

Next, a predetermined opening portion is formed on the oxide film 916 at a predetermined position by photo etching. After etching the oxide film, subsequently, the semiconductor substrate is etched thus forming a trench 920 having a depth which goes beyond the pn junction as measured from one surface of the semiconductor substrate (see FIG. 8(b)).

(c) Glass Layer Forming Step

Next, a layer made of glass composition for protecting a semiconductor junction is formed on an inner surface of the trench 920 and a surface of the semiconductor substrate in the vicinity of the trench 920 by electrophoresis, and the layer made of glass composition for protecting a semiconductor junction is baked so that a glass layer 924 for passivation is formed on a surface of the trench 920 (see FIG. 8(c)).

(d) Photoresist Forming Step

Next, a photoresist 926 is formed such that the photoresist 926 covers a surface of the glass layer 912 (see FIG. 8(d)).

(e) Oxide Film Removing Step

Next, the oxide film 916 is etched using the photoresist 926 as a mask so that the oxide film 916 at a portion 930 where a Ni-plating electrode film is to be formed is removed (see FIG. 9(a)).

(f) Roughened Surface Region Forming Step

Next, a surface of the semiconductor substrate at the position 930 where the Ni-plating electrode film is to be formed is subjected to surface roughening treatment thus forming a roughened surface region 932 for enhancing adhesiveness between a Ni plating electrode and the semiconductor substrate (see FIG. 9(b)).

(g) Electrode Forming Step

Next, Ni plating is applied to the semiconductor substrate thus forming an anode electrode 934 on the roughened surface region 932 and forming a cathode electrode 936 on the other surface of the semiconductor substrate (see FIG. 9(c)).

(h) Semiconductor Substrate Cutting Step

Next, the semiconductor substrate is cut by dicing or the like at a center portion of the glass layer 924 thus dividing the semiconductor substrate into chips which constitute mesa semiconductor devices (pn diodes) respectively (see FIG. 9(d)).

As has been explained heretofore, the conventional method of manufacturing a semiconductor device includes the step of forming the trench 920 which goes beyond the pn junction as measured from one surface of the semiconductor substrate where the pn junction arranged parallel to the main surface is formed (see FIG. 8(a) and FIG. 8(b)), and the step of forming the glass layer 924 for passivation in the inside of the trench 920 such that the glass layer 924 covers the pn junction exposure portion (see FIG. 8(c)). Accordingly, in the conventional method of manufacturing a semiconductor device, by cutting the semiconductor substrate after forming the glass layer 924 for passivation in the inside of the trench 920, mesa semiconductor devices having a high breakdown voltage can be manufactured.

PRIOR ART DOCUMENT

Patent Literature

Patent Literature 1 JP-A-2004-87955

SUMMARY OF THE INVENTION

Technical Problem

A glass material which is used for forming a glass layer for passivation is required to satisfy following conditions (a) to (d), that is, the condition (a) that a glass material can be baked at a proper temperature (1100° C. or below, for example), the condition (b) that a glass material withstands chemicals used in steps, the condition (c) that a glass material has a thermal expansion coefficient close to a thermal expansion coefficient of silicon (particularly, an average thermal expansion coefficient at a temperature of 50° C. to 500° C. being close to an average thermal expansion coefficient of silicon at a temperature of 50° C. to 500° C.), and the condition (d) that a glass material has excellent insulation property. In view of the above, "a glass material containing lead silicate as a main component" has been popularly used.

However, "the glass material containing lead silicate as a main component" contains lead which imposes a large burden on an environment and hence, it is thought that the use of "the glass material containing lead silicate as a main component" will be banned near future.

On the other hand, according to the experiments carried out by the inventors of the present invention, it is found that in the case where a glass material containing no lead is used as a glass material used for forming a glass layer for passivation, even when no bubbles are generated during a process of manufacturing a glass composition for protecting a semiconductor junction, there may be a case where bubbles are generated from a boundary surface between a "layer made of glass composition for protecting a semiconductor junction" formed by electrophoresis and a semiconductor substrate (silicon) during a process of baking the layer made of glass composition for protecting a semiconductor junction. In such a case, a reverse breakdown voltage characteristic of the semiconductor device is deteriorated.

The present invention has been made in view of the above-mentioned circumstances, and it is an object of the present invention to provide a glass composition for protecting a semiconductor junction, a method of manufacturing a semiconductor device and a semiconductor device by which a semiconductor device having a high breakdown voltage can be manufactured using a glass material containing no lead in the same manner as a conventional case where "a glass material containing lead silicate as a main component" is used.

It is also an object of the present invention to provide a glass composition for protecting a semiconductor junction, a method of manufacturing a semiconductor device and a semiconductor device by which it is possible to suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction whereby the deterioration of a reverse breakdown voltage characteristic of the semiconductor device can be suppressed.

Solution to Problem

[1] A glass composition for protecting a semiconductor junction according to the present invention contains at least $SiO_2$, $Al_2O_3$, MO, and "at least one metal oxide selected from a group consisting of nickel oxide, copper oxide and manganese oxide", and substantially contains none of Pb, P, As, Sb, Li, Na and K. Here, M in the above-mentioned MO indicates one of alkali earth metals.

[2] In the glass composition for protecting a semiconductor junction according to the present invention, it is preferable that the glass composition for protecting a semiconductor junction contains nickel oxide as the above-mentioned "at least one metal oxide selected from a group consisting of nickel oxide, copper oxide and manganese oxide".

[3] In the glass composition for protecting a semiconductor junction according to the present invention, it is preferable that the content of $SiO_2$ is set to a value which falls within a range of 53 mol % to 73 mol %, the content of $Al_2O_3$ is set to a value which falls within a range of 11 mol % to 21 mol %, the content of CaO is set to a value which falls within a range of 3 mol % to 9 mol %, the content of MgO is set to a value which falls within a range of 11 mol % to 21 mol %, and the content of nickel oxide is set to a value which falls within a range of 0.01 mol % to 3 mol %.

[4] In the glass composition for protecting a semiconductor junction according to the present invention, it is preferable that the content of $SiO_2$ is set to a value which falls within a range of 32 mol % to 48 mol %, the content of $Al_2O_3$ is set to a value which falls within a range of 9 mol % to 13 mol %, the content of CaO is set to a value which falls within a range of 15 mol % to 23 mol %, the content of ZnO is set to a value which falls within a range of 18 mol % to 28 mol %, the content of $B_2O_3$ is set to a value which falls within a range of 3 mol % to 10 mol %, and the content of nickel oxide is set to a value which falls within a range of 0.01 mol % to 3 mol %.

[5] A method of manufacturing a semiconductor device according to the present invention is a method of manufacturing a semiconductor device which includes: a first step of preparing a semiconductor element having a pn junction exposure portion where a pn junction is exposed; and a second step of forming a glass layer such that the glass layer covers the pn junction exposure portion in this order, wherein in the second step, the glass layer is formed using a glass composition for protecting a semiconductor junction which contains at least $SiO_2$, $Al_2O_3$, MO, and "at least one metal oxide selected from a group consisting of nickel oxide, copper oxide and manganese oxide", and substantially contains none of Pb, P, As, Sb, Li, Na and K. Here, M in the above-mentioned MO indicates one of alkali earth metals.

[6] In the method of manufacturing a semiconductor device according to the present invention, it is preferable that the first step includes: a step of preparing a semiconductor substrate having a pn junction arranged parallel to a main surface of the semiconductor substrate; and a step of forming a trench having a depth which goes beyond the pn junction as measured from one surface of the semiconductor substrate thus forming the pn junction exposure portion in the inside of the trench, and the second step includes a step of forming the glass layer such that the glass layer covers the pn junction exposure portion in the inside of the trench.

[7] In the method of manufacturing a semiconductor device according to the present invention, it is preferable that the second step includes a step of forming the glass layer such that the glass layer directly covers the pn junction exposure portion in the inside of the trench.

[8] In the method of manufacturing a semiconductor device according to the present invention, it is preferable that the second step includes a step of forming an insulation film on the pn junction exposure portion in the inside of the trench, and a step of forming the glass layer such that the glass layer covers the pn junction exposure portion with the insulation film interposed therebetween.

[9] In the method of manufacturing a semiconductor device according to the present invention, it is preferable that the first step includes a step of forming the pn junction exposure portion on a surface of a semiconductor substrate, and the second step includes a step of forming the glass layer such that the glass layer covers the pn junction exposure portion on the surface of the semiconductor substrate.

[10] In the method of manufacturing a semiconductor device according to the present invention, it is preferable that the second step includes a step of forming the glass layer such that the glass layer directly covers the pn junction exposure portion on the surface of the semiconductor substrate.

[11] In the method of manufacturing a semiconductor device according to the present invention, it is preferable that the second step includes a step of forming an insulation film on the pn junction exposure portion on the surface of the semiconductor substrate, and a step of forming the glass layer such that the glass layer covers the pn junction exposure portion with the insulation film interposed therebetween.

[12] In the method of manufacturing a semiconductor device according to the present invention, it is preferable that the glass composition for protecting a semiconductor junction contains nickel oxide as the above-mentioned "at least one metal oxide selected from a group consisting of nickel oxide, copper oxide and manganese oxide".

[13] In the method of manufacturing a semiconductor device according to the present invention, it is preferable that the glass composition for protecting a semiconductor junction is set such that the content of $SiO_2$ falls within a range of 53 mol % to 73 mol %, the content of $Al_2O_3$ falls within a range of 11 mol % to 21 mol %, the content of CaO falls within a range of 3 mol % to 9 mol %, the content of MgO falls within a range of 11 mol % to 21 mol %, and the content of nickel oxide falls within a range of 0.01 mol % to 3 mol %.

[14] In the method of manufacturing the semiconductor device according to the present invention, it is preferable that the glass composition for protecting a semiconductor junction is set such that the content of $SiO_2$ falls within a range of 32 mol % to 48 mol %, the content of $Al_2O_3$ falls within a range of 9 mol % to 13 mol %, the content of CaO falls within a range of 15 mol % to 23 mol %, the content of ZnO falls within a range of 18 mol % to 28 mol %, the content of $B_2O_3$ falls within a range of 3 mol % to 10 mol %, and the content of nickel oxide falls within a range of 0.01 mol % to 3 mol %.

[15] A semiconductor device according to the present invention is a semiconductor device which includes a semiconductor element having a pn junction exposure portion where a pn junction is exposed, and a glass layer which is formed such that the glass layer covers the pn junction exposure portion, wherein the glass layer is formed using a glass composition for protecting a semiconductor junction which contains at least $SiO_2$, $Al_2O_3$, MO, and "at least one metal oxide selected from a group consisting of nickel oxide, copper oxide and manganese oxide", and substantially contains none of Pb, P, As, Sb, Li, Na and K. Here, M in the above-mentioned MO indicates one of alkali earth metals.

[16] In the semiconductor device according to the present invention, it is preferable that the glass composition for protecting a semiconductor junction contains nickel oxide as the above-mentioned "at least one metal oxide selected from a group consisting of nickel oxide, copper oxide and manganese oxide".

[17] In the semiconductor device according to the present invention, it is preferable that the glass composition for protecting a semiconductor junction is set such that the content of $SiO_2$ falls within a range of 53 mol % to 73 mol %, the content of $Al_2O_3$ falls within a range of 11 mol % to 21 mol %, the content of CaO falls within a range of 3 mol % to 9 mol %, the content of MgO falls within a range of 11 mol % to 21 mol %, and the content of nickel oxide falls within a range of 0.01 mol % to 3 mol %.

[18] In the semiconductor device according to the present invention, it is preferable that the glass composition for protecting a semiconductor junction is set such that the content of $SiO_2$ falls within a range of 32 mol % to 48 mol %, the content of $Al_2O_3$ falls within a range of 9 mol % to 13 mol %, the content of CaO falls within a range of 15 mol % to 23 mol %, the content of ZnO falls within a range of 18 mol % to 28 mol %, the content of $B_2O_3$ falls within a range of 3 mol % to 10 mol %, and the content of nickel oxide falls within a range of 0.01 mol % to 3 mol %.

Advantageous Effects of Invention

According to the glass composition for protecting a semiconductor junction, the method of manufacturing a semiconductor device and the semiconductor device of the present invention, as can be clearly understood from examples described later, in the same manner as a conventional case where "a glass material containing lead silicate as a main component" is used, a semiconductor device having a high breakdown voltage can be manufactured by using a glass material containing no lead.

According to the glass composition for protecting a semiconductor junction, the method of manufacturing a semiconductor device and the semiconductor device of the present invention, the glass composition for protecting a semiconductor junction contains at least one metal oxide selected from a group consisting of nickel oxide, copper oxide and manganese oxide and hence, as can be clearly understood from examples described later, it is possible to suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction whereby the deterioration of a reverse breakdown voltage characteristic of the semiconductor device can be suppressed. Here, the detail of the reason the generation of bubbles generated from the boundary surface between the layer made of glass composition for protecting a semiconductor junction and the semiconductor substrate (silicon) during a process of baking the "layer made of glass composition for protecting a semiconductor junction" can be suppressed when the glass composition for protecting a semiconductor junction contains metal oxide such as nickel oxide is unknown. However, the inventors of the present invention estimate that when the glass composition for protecting a semiconductor junction contains metal oxide such as nickel oxide, "wettability of the glass composition for protecting a semiconductor junction with the semiconductor substrate (silicon) is increased so that bubbles are hardly generated".

In the glass composition for protecting a semiconductor junction according to the present invention, "the composition substantially contains none of Pb, P, As, Sb, Li, Na and K" means that "the composition contains none of Pb, P, As, Sb, Li, Na and K as components" and does not exclude the glass composition where the above-mentioned components are mixed into raw materials of the respective components which constitute glass as impurities. The same goes for the method of manufacturing a semiconductor device and the semiconductor device according to the present invention.

The reason the composition substantially contains no Pb is that the object of the present invention lies in that the semiconductor device having a high breakdown voltage can be manufactured by using "a glass material containing no lead" in the same manner as the conventional case where "a glass material containing lead silicate as a main component" is used.

Further, the reason the composition substantially contains none of P, As and Sb is that although it is advantageous in terms of a baking temperature when the glass composition contains these components, there may be case where the insulation property is lowered due to the diffusion of these components into the semiconductor substrate during baking.

Further, the reason the glass composition substantially contains none of Li, Na and K is that although it is advantageous in terms of an average thermal expansion coefficient and a baking temperature when the glass composition contains these components, there may be a case where insulation property is lowered.

Inventors of the present invention have studied and found that even when the glass composition substantially contains none of these components (that is, Pb, P, As, Sb, Li, Na, K), provided that the glass composition contains at least $SiO_2$, $Al_2O_3$, MO, and "at least one metal oxide selected from a group consisting of nickel oxide, copper oxide and manganese oxide", the glass composition can be used as a glass composition for protecting a semiconductor junction. That is, according to the glass composition for protecting a semiconductor junction of the present invention, as can be clearly understood from the examples described later, the semiconductor device having a high breakdown voltage can be manufactured by using "a glass material containing no lead" in the same manner as the conventional case where "a glass material containing lead silicate as a main component" is used.

BRIEF DESCRIPTION OF DRAWINGS

FIG. 5 is a Table showing a result of examples.

FIGS. 6(a) and 6(b) are views for explaining bubbles b generated in the inside of a glass layer 124 in the preliminary evaluation.

FIGS. 7(a) and 7(b) are photographs for explaining the bubbles b generated in the inside of the glass layer 124 in the subsequent evaluation.

DESCRIPTION OF EMBODIMENTS

Figure 1A:
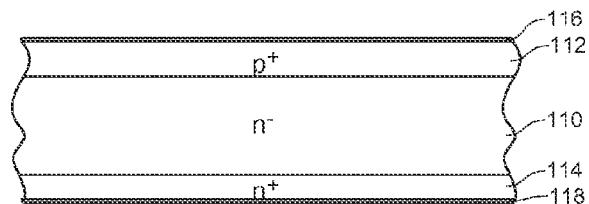
FIG. 1(a) to FIG. 1(d) are views for explaining a method of manufacturing a semiconductor device according to an embodiment 3.
Figure 1B:
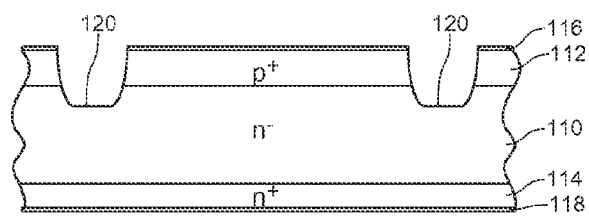

Hereinafter, a glass composition for protecting a semiconductor junction, a method of manufacturing a semiconductor device, and a semiconductor device according to the present invention are explained in conjunction with embodiments shown in the drawings.

Embodiment 1

The embodiment 1 relates to a glass composition for protecting a semiconductor junction.

The glass composition for protecting a semiconductor junction according to the embodiment 1 contains $SiO_2$, $Al_2O_3$, CaO, MgO, and nickel oxide, and substantially contains none of Pb, P, As, Sb, Li, Na and K.

To be more specific, the content of $SiO_2$ is set to a value which falls within a range of 53 mol % to 73 mol % (for example, 62.6 mol %), the content of $Al_2O_3$ is set to a value which falls within a range of 11 mol % to 21 mol % (for example, 15.3 mol %), the content of CaO is set to a value which falls within a range of 3 mol % to 9 mol % (5.5 mol %), the content of MgO is set to a value which falls within a range of 11 mol % to 21 mol % (for example, 15.6 mol %), and the content of nickel oxide is set to a value which falls within a range of 0.01 mol % to 3 mol % (for example, 1 mol %).

According to the glass composition for protecting a semiconductor junction of the embodiment 1, as can be understood also from embodiments described later, it is possible to manufacture a semiconductor device having a high breakdown voltage using a glass material containing no lead in the same manner as a conventional case where "a glass material containing lead silicate as a main component" is used.

According to the glass composition for protecting a semiconductor junction of the embodiment 1, the glass composition for protecting a semiconductor junction contains nickel oxide and hence, as can be understood from examples described later, it is possible to suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction whereby the deterioration of a reverse breakdown voltage characteristic of the semiconductor device can be suppressed.

The reason the content of $SiO_2$ is set to a value which falls within a range of 53 mol % to 73 mol % is that when the content of $SiO_2$ is less than 53 mol %, there may be a case where the resistance to chemicals is lowered or the insulation property is lowered, while when the content of $SiO_2$ exceeds 73 mol %, there exists a tendency that a baking temperature needs to be elevated.

The reason the content of $Al_2O_3$ is set to a value which falls within a range of 11 mol % to 21 mol % is that when the content of $Al_2O_3$ is less than 11 mol %, there may be a case where the resistance to chemicals is lowered or the insulation property is lowered, while when the content of $Al_2O_3$ exceeds 21 mol %, there exists a tendency that a baking temperature needs to be elevated.

The reason the content of CaO is set to a value which falls within a range of 3 mol % to 9 mol % is that when the content of CaO is less than 3 mol %, there exists a tendency that a baking temperature needs to be elevated, while when the content of CaO exceeds 9 mol %, there may be a case where the resistance to chemicals is lowered or the insulation property is lowered.

The reason the content of MgO is set to a value which falls within a range of 11 mol % to 21 mol % is that when the content of MgO is less than 11 mol %, there may be a case where the resistance to chemicals is lowered or the insulation property is lowered, while when the content of MgO exceeds 21 mol %, there exists a tendency that a baking temperature needs to be elevated.

The reason the content of nickel oxide is set to a value which falls within a range of 0.01 mol % to 3 mol % is that when the content of nickel oxide is less than 0.01 mol %, there exists a case where it becomes difficult to suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction, while when the content of nickel oxide exceeds 3 mol %, there may be a case where it becomes difficult to manufacture homogeneous glass.

The glass composition for protecting a semiconductor junction according to the embodiment 1 can be manufactured as follows. That is, raw materials ($SiO_2$, $Al(OH)_3$, $CaCO_3$, $Mg(OH)_2$, and NiO) are prepared at the above-mentioned composition ratio (molar ratio), and these raw materials are sufficiently mixed by a mixer and, thereafter, the mixed raw material is put into a platinum crucible whose temperature is elevated to a predetermined temperature in an electric furnace and is melted for a predetermined time. Then, the material in a molten state is made to flow out from the crucible and is fed to water-cooled rolls so that glass flakes in a thin flaky shape are obtained. Thereafter, the glass flakes are pulverized to a predetermined average particle size by a ball mill or the like thus obtaining powdery glass composition.

Embodiment 2

The glass composition for protecting a semiconductor junction according to the embodiment 2 contains $SiO_2$, $Al_2O_3$, CaO, ZnO, $B_2O_3$, and nickel oxide, and substantially contains none of Pb, P, As, Sb, Li, Na and K.

To be more specific, the content of $SiO_2$ is set to a value which falls within a range of 32 mol % to 48 mol % (for example, 39.6 mol %), the content of $Al_2O_3$ is set to a value which falls within a range of 9 mol % to 13 mol % (for example, 10.9 mol %), the content of CaO is set to a value which falls within a range of 15 mol % to 23 mol % (for example, 18.8 mol %), the content of ZnO is set to a value which falls within a range of 18 mol % to 28 mol % (for example, 22.8 mol %), the content of $B_2O_3$ is set to a value which falls within a range of 3 mol % to 10 mol % (for example, 6.9 mol %), and the content of nickel oxide is set to a value which falls within a range of 0.01 mol % to 3 mol % (for example, 1 mol %).

According to the glass composition for protecting a semiconductor junction of the embodiment 2, as can be understood also from examples described later, it is possible to manufacture a semiconductor device having a high breakdown voltage using a glass material containing no lead in the same manner as a conventional case where "a glass material containing lead silicate as a main component" is used.

According to the glass composition for protecting a semiconductor junction of the embodiment 2, the glass composition for protecting a semiconductor junction contains nickel oxide and hence, as can be also clearly understood from examples described later, it is possible to suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction whereby the deterioration of a reverse breakdown voltage characteristic of the semiconductor device can be suppressed.

The reason the content of $SiO_2$ is set to a value which falls within a range of 32 mol % to 48 mol % is that when the content of $SiO_2$ is less than 32 mol %, there may be a case where the resistance to chemicals is lowered or the insulation property is lowered, while when the content of $SiO_2$ exceeds 48 mol %, there exists a tendency that a baking temperature needs to be elevated.

The reason the content of $Al_2O_3$ is set to a value which falls within a range of 9 mol % to 13 mol % is that when the content of $Al_2O_3$ is less than 9 mol %, there may be a case where the resistance to chemicals is lowered or the insulation property is lowered, while when the content of $Al_2O_3$ exceeds 13 mol %, there exists a tendency that a baking temperature needs to be elevated.

The reason the content of CaO is set to a value which falls within a range of 15 mol % to 23 mol % is that when the content of CaO is less than 15 mol %, there exists a tendency that a baking temperature needs to be elevated, while when the content of CaO exceeds 23 mol %, there may be a case where the resistance to chemicals is lowered or the insulation property is lowered.

The reason the content of ZnO is set to a value which falls within a range of 18 mol % to 28 mol % is that when the content of ZnO is less than 18 mol %, there exists a tendency that a baking temperature needs to be elevated, while when the content of ZnO exceeds 28 mol %, there may be a case where the resistance to chemicals is lowered, the insulation property is lowered, or bubbles are generated in the inside of the glass layer.

The reason the content of $B_2O_3$ is set to a value which falls within a range of 3 mol % to 10 mol % is that when the content of $B_2O_3$ is less than 3 mol %, there exists a tendency that a baking temperature needs to be elevated, while when the content of $B_2O_3$ exceeds 10 mol %, there may be a case where the insulation property is lowered.

The reason the content of nickel oxide is set to a value which falls within a range of 0.01 mol % to 3 mol % is that when the content of nickel oxide is less than 0.01 mol %, there exists a case where it becomes difficult to suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction, while when the content of nickel oxide exceeds 3 mol %, there may be a case where it is difficult to manufacture a homogeneous glass.

The glass composition for protecting a semiconductor junction according to the embodiment 2 can be manufactured as follows. That is, raw materials ($SiO_2$, $Al(OH)_3$, $CaCO_3$, ZnO, $H_3BO_3$, and NiO) are prepared at the above-mentioned composition ratio (molar ratio), and these raw materials are sufficiently mixed by a mixer and, thereafter, the mixed raw material is put into a platinum crucible whose temperature is elevated to a predetermined temperature in an electric furnace and is melted for a predetermined time. Then, the material in a molten state is made to flow out from the crucible and is fed to water-cooled rolls so that glass flakes in a thin flaky shape is obtained. Thereafter, the glass flakes are pulverized to a predetermined average particle size by a ball mill or the like thus obtaining powdery glass composition.

Embodiment 3

The embodiment 3 relates to a method of manufacturing a semiconductor device.

The method of manufacturing a semiconductor device according to the embodiment 3 is a method of manufacturing a semiconductor device which includes: a first step of preparing a semiconductor element which includes a pn junction exposure portion where a pn junction is exposed; and a second step of forming a glass layer such that the glass layer covers the pn junction exposure portion in this order. In the second step, the glass layer is formed using a glass composition for protecting a semiconductor junction which contains $SiO_2$, $Al_2O_3$, CaO, MgO, and nickel oxide, and substantially contains none of Pb, P, As, Sb, Li, Na and K (the glass composition for protecting a semiconductor junction according to the embodiment 1). The first step includes a step of preparing a semiconductor substrate including a pn junction arranged parallel to a main surface of the semiconductor substrate, and a step of forming a trench having a depth which goes beyond the pn junction as measured from one surface of the semiconductor substrate thus forming the pn junction exposure portion in the inside of the trench, and the second step includes a step of forming the glass layer such that the glass layer directly covers the pn junction exposure portion in the inside of the trench.

FIG. 1(a) to FIG. 1(d) and FIG. 2(a) to FIG. 2(d) are views for explaining a method of manufacturing a semiconductor device according to the embodiment 3. That is, FIG. 1(a) to FIG. 1(d) and FIG. 2(a) to FIG. 2(d) are views showing respective steps of the method of manufacturing a semiconductor device according to the embodiment 3.

In the method of manufacturing a semiconductor device according to the embodiment 3, as shown in FIG. 1(a) to FIG. 1(d) and FIG. 2(a) to FIG. 2(d), "semiconductor substrate forming step", "trench forming step", "glass layer forming step", "photoresist forming step", "oxide film removing step", "roughened surface region forming step", "electrode forming step", and "semiconductor substrate cutting step" are carried out in this order. Hereinafter, the method of manufacturing the semiconductor device according to the embodiment 3 is explained in order of steps.

(a) Semiconductor Substrate Forming Step

Firstly, a p+ type diffusion layer 112 is formed by diffusion of a p type impurity from one surface of an n− type semiconductor substrate (n− type silicon substrate) 110, and an n+ type diffusion layer 114 is formed by diffusion of an n type impurity from the other surface of the n− type semiconductor substrate 110 thus forming a semiconductor substrate in which a pn junction arranged parallel to a main surface of the semiconductor substrate is formed. Thereafter, oxide films 116, 118 are formed by thermal oxidation on a surface of the p+ type diffusion layer 112 and a surface of the n+ type diffusion layer 114 respectively (see FIG. 1(a)).

(b) Trench Forming Step

Next, a predetermined opening portion is formed on the oxide film 116 at a predetermined position by a photo etching method. After etching the oxide film, subsequently, the semiconductor substrate is etched thus forming a trench 120 having a depth which goes beyond the pn junction as measured from one surface of the semiconductor substrate (see FIG. 1(b)).

(c) Glass Layer Forming Step

Figure 1C:
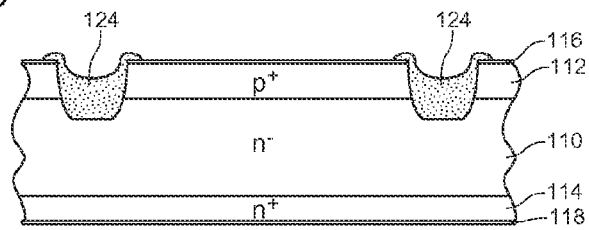

Next, a layer made of glass composition for protecting a semiconductor junction according to the embodiment 1 is formed on an inner surface of the trench 120 and a surface of the semiconductor substrate in the vicinity of the trench 120 by electrophoresis, and the layer made of glass composition for protecting a semiconductor junction is baked so that a glass layer 124 for passivation is formed (see FIG. 1(c)). Accordingly, the pn junction exposure portion in the inside of the trench 120 is directly covered with the glass layer 124.

(d) Photoresist Forming Step

Figure 1D:
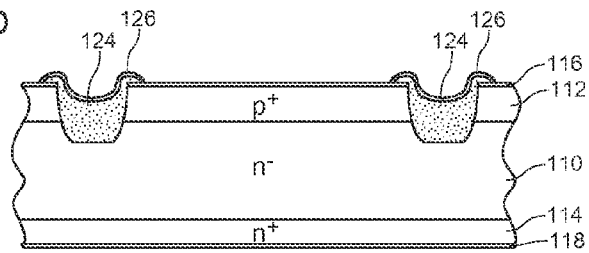

Next, a photoresist 126 is formed such that the photoresist 126 covers a surface of the glass layer 112 (see FIG. 1(d)).

(e) Oxide Film Removing Step

Figure 2A:
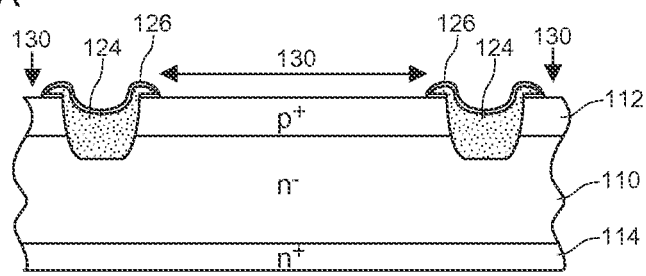
FIG. 2(a) to FIG. 2(d) are views for explaining the method of manufacturing the semiconductor device according to the embodiment 3.

Next, the oxide film 116 is etched using the photoresist 126 as a mask so that the oxide film 116 at a position 130 where a Ni-plating electrode film is to be formed is removed (see FIG. 2(a)).

(f) Roughened Surface Region Forming Step

Figure 2B:
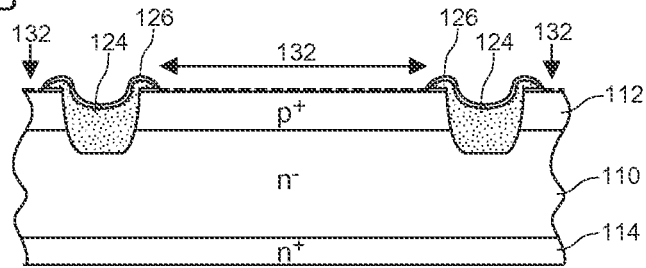

Next, a surface of the semiconductor substrate at the position 130 where the Ni-plating electrode film is to be formed is subjected to surface roughening treatment thus forming a roughened surface region 132 for enhancing adhesiveness between a Ni plating electrode and the semiconductor substrate (see FIG. 2(b)).

(g) Electrode Forming Step

Figure 2C:
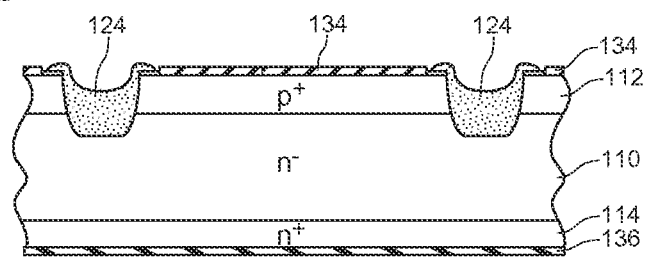

Next, Ni plating is applied to the semiconductor substrate thus forming an anode electrode 134 on the roughened surface region 132 and forming a cathode electrode 136 on the other surface of the semiconductor substrate (see FIG. 2(c)).

(h) Semiconductor Substrate Cutting Step

Figure 2D:
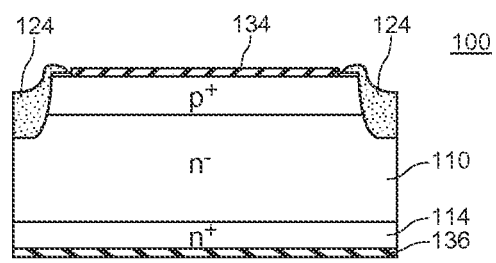

Next, the semiconductor substrate is cut by dicing or the like at a center portion of the glass layer 124 thus dividing the semiconductor substrate into chips which constitute mesa semiconductor devices (pn diodes) (see FIG. 2(d)).

Through the above-mentioned steps, the mesa semiconductor device having a high breakdown voltage (semiconductor device according to the embodiment 3) can be manufactured.

Embodiment 4

An embodiment 4 relates to a method of manufacturing a semiconductor device.

The method of manufacturing a semiconductor device according to the embodiment 4 is, in the same manner as the method of manufacturing a semiconductor device according to the embodiment 3, a method of manufacturing a semiconductor device which includes: a first step of preparing a semiconductor element which includes a pn junction exposure portion where a pn junction is exposed; and a second step of forming a glass layer such that the glass layer covers the pn junction exposure portion in this order. In the second step, the glass layer is formed using a glass composition for protecting a semiconductor junction which contains $SiO_2$, $Al_2O_3$, CaO, MgO, and nickel oxide, and substantially contains none of Pb, P, As, Sb, Li, Na and K (the glass composition for protecting a semiconductor junction according to the embodiment 1). However, different from the method of manufacturing a semiconductor device according to the embodiment 3, in the method of manufacturing a semiconductor device according to the embodiment 4, the first step includes a step of forming the pn junction exposure portion on a surface of the semiconductor substrate, and the second step includes a step of forming the glass layer such that the glass layer directly covers the pn junction exposure portion on the surface of the semiconductor substrate.

FIG. 3(a) to FIG. 3(c) and FIG. 4(a) to FIG. 4(c) are views for explaining a method of manufacturing a semiconductor device according to the embodiment 4. That is, FIG. 3(a) to FIG. 3(c) and FIG. 4(a) to FIG. 4(c) are views showing respective steps of the method of manufacturing a semiconductor device.

In the method of manufacturing the semiconductor device according to the embodiment 4, as shown in FIG. 3(a) to FIG. 3(c) and FIG. 4(a) to FIG. 4(c), "semiconductor substrate preparing step", "p+ type diffusion layer forming step", "n+ type diffusion layer forming step", "glass layer forming step", "glass layer etching step" and "electrode forming step" are carried out in this order. Hereinafter, the method of manufacturing a semiconductor device according to the embodiment 4 is explained in order of steps.

(a) Semiconductor Substrate Preparing Step

Figure 3A:
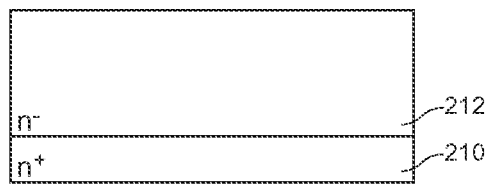
FIG. 3(a) to FIG. 3(c) are views for explaining a method of manufacturing a semiconductor device according to an embodiment 4.
Figure 3B:
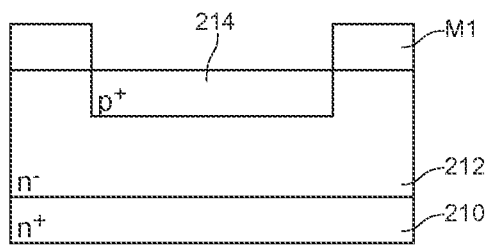
Figure 3C:
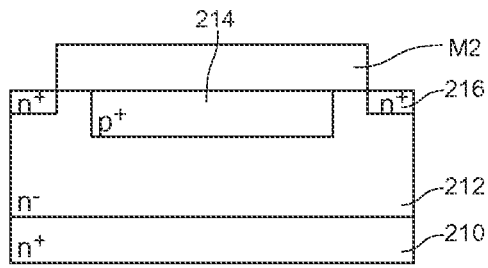
Figure 4A:
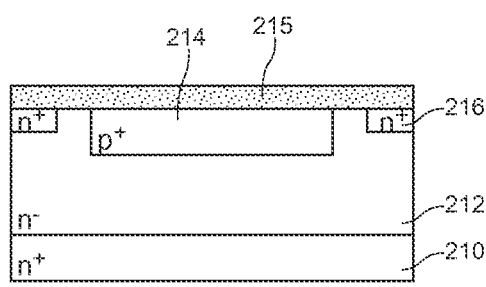
FIG. 4(a) to FIG. 4(c) are views for explaining the method of manufacturing the semiconductor device according to the embodiment 4.
Figure 4B:
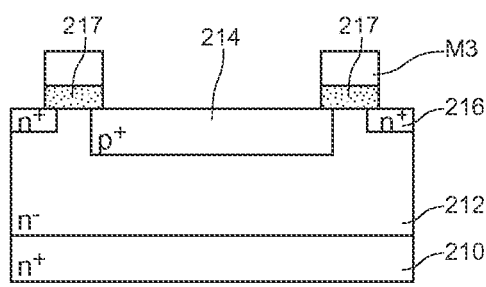
Figure 4C:
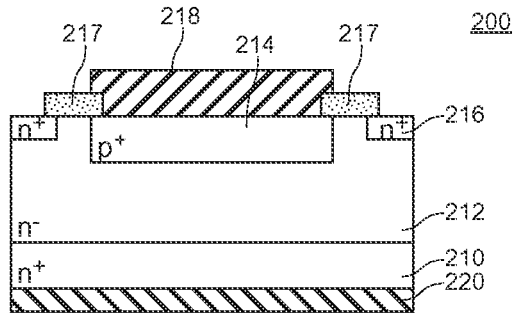
Figure 8A:
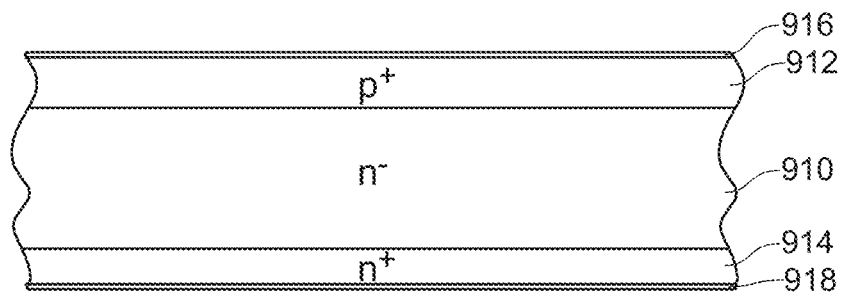
FIG. 8(a) to FIG. 8(d) are views for explaining a conventional method of manufacturing a semiconductor device.
Figure 8B:
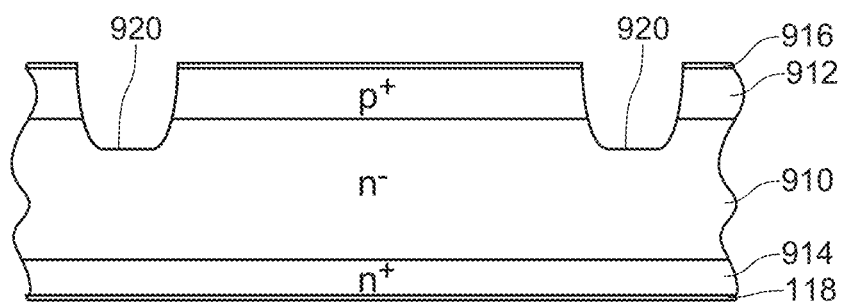
Figure 8C:
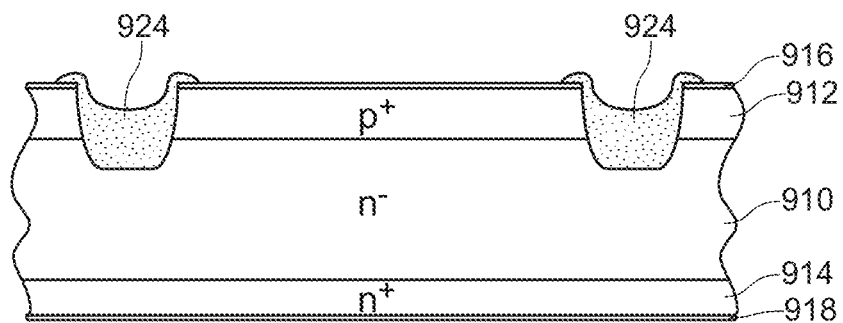
Figure 8D:
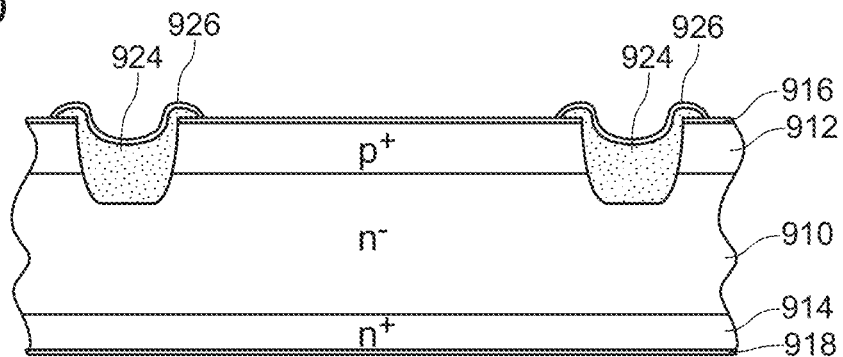
Figure 9A:
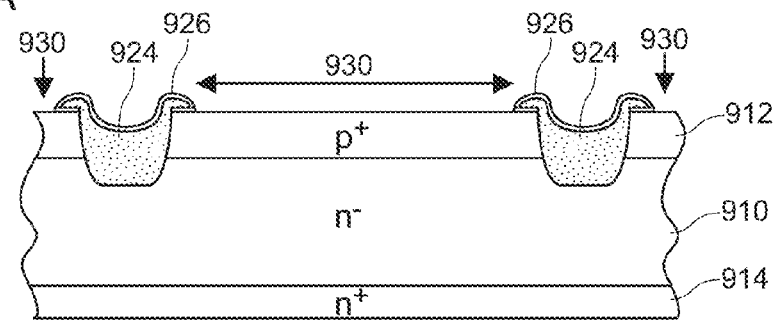
FIG. 9(a) to FIG. 9(d) are views for explaining the conventional method of manufacturing the semiconductor device.
Figure 9B:
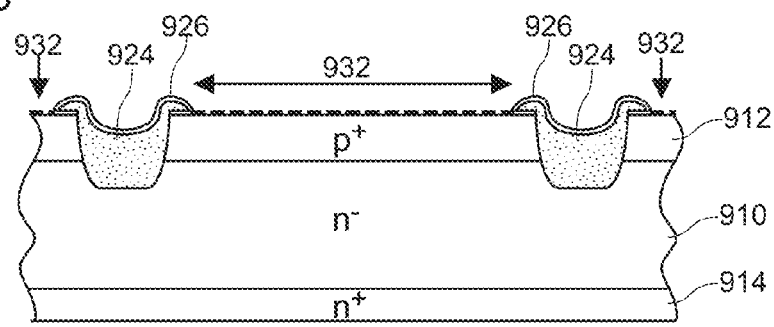
Figure 9C:
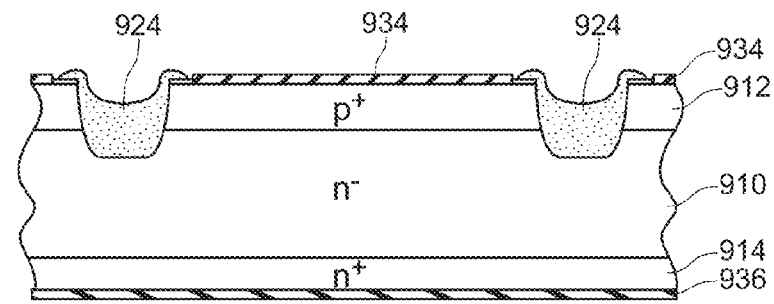
Figure 9D:
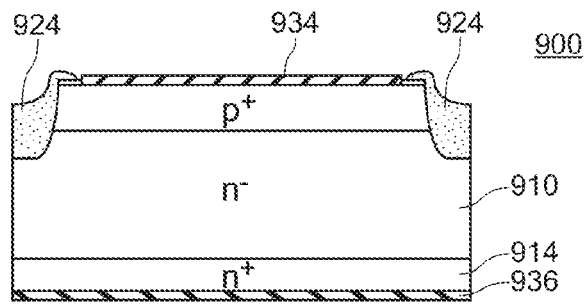

Firstly, a semiconductor substrate where an n− type epitaxial layer 212 is laminated on an n+ type silicon substrate 210 is prepared (see FIG. 3(a)).

(b) p+ Type Diffusion Layer Forming Step

Next, after forming a mask M1 on the n− type epitaxial layer 212, a p type impurity (boron ion, for example) is implanted to a predetermined region on a surface of the n− type epitaxial layer 212 by an ion implantation method using the mask M1. Then, a p+ type diffusion layer 214 is formed by thermal diffusion (see FIG. 3(b)).

(c) n+ Type Diffusion Layer Forming Step

Next, the mask M1 is removed from the n− type epitaxial layer 212 and a mask 2 is formed on the n− type epitaxial layer 212. Thereafter, an n− type impurity (arsenic ion, for example) is implanted to a predetermined region on the surface of the n− type epitaxial layer 212 by an ion implantation method using the mask 2. Then, an n+ type diffusion layer 216 is formed by thermal diffusion (see FIG. 3(c)).
(d) Glass Layer Forming Step Next, the mask M2 is removed from the n− type epitaxial layer 212. Thereafter, a layer made of glass composition for protecting a semiconductor junction according to the embodiment 1 is formed on the surface of the n− type epitaxial layer 212 by a spin coating method and, thereafter, the layer made of glass composition for protecting a semiconductor junction is baked thus forming a glass layer 215 for passivation (see FIG. 4(a)).
(e) Glass Layer Etching Step Next, a mask M3 is formed on a surface of the glass layer 215 and, thereafter, the glass layer 215 is etched (see FIG. 4(b)). Due to such etching, a glass layer 217 is formed on a predetermined region on the surface of the n− type epitaxial layer 212.
(f) Electrode Forming Step Next, the mask M3 is removed from the surface of the glass layer 215 and, thereafter, an anode electrode 218 is formed on a region of the surface of the semiconductor substrate surrounded by the glass layer 217, and a cathode electrode 220 is formed on a back surface of the semiconductor substrate (see FIG. 4(c)).

Through the above-mentioned steps, a planer semiconductor device having a high breakdown voltage (the semiconductor device according to the embodiment 4) can be manufactured.

EXAMPLES

1. Preparation of Specimens

FIG. 5 is a table showing results of examples. In the examples, raw materials are prepared to have composition ratios described in examples 1 and 2 and reference examples 1 to 4 (see FIG. 5), and these raw materials are sufficiently mixed by a mixer and, thereafter, the mixed raw material is put into a platinum crucible whose temperature is elevated to a temperature of 1550° C. in an electric furnace and is melted for two hours. Thereafter, the material in a molten state is made to flow out from the crucible and is fed to water-cooled rolls so that glass flakes in a thin flaky shape are obtained. Thereafter, the glass flakes are pulverized to an average particle size of 5 m by a ball mill thus obtaining powdery glass composition.

The raw materials used in the examples are $SiO_2$, $Al(OH)_3$, $CaCO_3$, $Mg(OH)_2$, ZnO, $H_3BO_3$, NiO, and PbO.

2. The Respective Glass Compositions Obtained by the Above-Mentioned Methods are Evaluated by the Following Evaluation Aspects (1) Evaluation Aspect 1 (Environmental Burden)

The object of the present invention lies in that a semiconductor device having a high breakdown voltage can be manufactured by using a glass material containing no lead in the same manner as the conventional case where "a glass material containing lead silicate as a main component" is used and hence, the score "good" is given when the glass composition contains no lead component, and the score "bad" is given when the glass composition contains a lead component.
(2) Evaluation Aspect 2 (Baking Temperature)

When the baking temperature is excessively high, the baking temperature largely influences a semiconductor device under manufacture. Accordingly, the score "good" is given when the baking temperature is equal to or below 1100° C., the score "fair" is given when the baking temperature falls within a range of 1100° C. to 1200° C., and the score "bad" is given when the baking temperature exceeds 1200° C.
(3) Evaluation Aspect 3 (Chemical Resistance)

The score "good" is given when the glass composition exhibits insolubility to all of aqua regia, a plating solution and a hydrofluoric acid, and the score "bad" is given when the glass composition exhibits solubility to any one of aqua regia, a plating solution and a hydrofluoric acid.
(4) Evaluation Aspect 4 (Average Thermal Expansion Coefficient)

The score "good" is given when the difference between an average thermal expansion coefficient of the glass composition and an average thermal expansion coefficient ($3.73 \cdot 10^{-6}$) of silicon at a temperature of 50° C. to 500° C. is equal to or less than "$0.5 \cdot 10^{-6}$", the score "fair" is given when the difference falls within a range of "$0.5 \cdot 10^{-6}$ to $1.0 \cdot 10^{-6}$", and the score "bad" is given when the difference exceeds "$1.0 \cdot 10^{-6}$".
(5) Evaluation Aspect 5 (Insulation Property)

A semiconductor device (pn diode) is manufactured by the same method as the method of manufacturing a semiconductor device according to the embodiment 3, and a reverse breakdown voltage characteristic of the manufactured semiconductor device is measured. As a result, the score "good" is given when the reverse breakdown voltage characteristic of the semiconductor device falls within a normal range, and the score "bad" is given when the reverse breakdown voltage characteristic of the semiconductor device falls outside a normal range.
(6) Evaluation Aspect 6 (Presence or Non-Presence of Generation of Bubbles)

A semiconductor device (pn diode) is manufactured by the same method as the method of manufacturing a semiconductor device according to the embodiment 3, and it is observed whether or not bubbles are generated in the inside of the glass layer (particularly, in the vicinity of a boundary surface between the glass layer and the silicon substrate) (preliminary evaluation). Further, a layer made of glass composition for protecting a semiconductor junction is formed by applying by coating the glass composition for protecting a semiconductor junction according to the embodiment 1 on the silicon substrate having a size of 10 mm square, and the layer made of glass composition for protecting a semiconductor junction is baked thus forming the glass layer. Then, it is observed whether or not bubbles are generated in the inside of the glass layer (particularly, in the vicinity of the boundary surface between the glass layer and the silicon substrate) (subsequent evaluation).

FIGS. 6(a) and 6(b) are views for explaining bubbles b generated in the inside of a glass layer 124 in the preliminary evaluation. FIG. 6(a) is a cross-sectional view of a semiconductor device when the bubbles b are not generated, while FIG. 6(b) is a cross-sectional view of a semiconductor device when the bubbles b are generated. FIGS. 7(a) and 7(b) are photographs for explaining the bubbles b generated in the inside of the glass layer 124 in subsequent evaluation. FIG. 7(a) is a photograph showing a boundary surface between an n− type silicon substrate 110 and the glass layer 124 when the bubbles b are not generated, while FIG. 7(b) is a photograph showing a boundary surface between the n− type silicon substrate 110 and the glass layer 124 when the bubbles b are generated in an enlarged manner. As a result of the experiment, it is understood that there is a favorable corresponding relationship between the result of preliminary evaluation and the subsequent evaluation result of the present invention. In the subsequent evaluation, the score "good" is given when no bubble having a diameter of 506 or more is generated in the inside of the glass layer 124, the score "fair" is given when one to twenty bubbles having a diameter of 50 μm or more are generated in the inside of the glass layer 124, and the score "bad" is given when twenty or more bubbles having a diameter of 50·m or more are generated in the inside of the glass layer 124.

(8) Comprehensive Evaluation

The score "good" is given when the respective scores given in accordance with the above-mentioned evaluation aspects 1 to 6 are all "good", the score "fair" is given when at least one of the respective scores is "fair", and the score "bad" is given when at least one of the respective scores is "bad".

3. Result of Evaluation

As can be understood from FIG. 5, the score "fair" is given to the glass composition of the reference example 1 and the glass composition of the reference example 2 with respect to the evaluation aspect 6. Further, score "bad" is given to the glass composition of the reference example 3 with respect to the evaluation aspect 1. Further, score "bad" is given to the glass composition of the reference example 4 with respect to the evaluation aspect 3. To the contrary, the score "good" is given to both of the glass composition of the example 1 and the glass composition of the example 2 with respect to all evaluation aspects (evaluation aspects 1 to 6). As a result, it is found that both of the glass composition of the embodiment 1 and the glass composition of the example 2 are glass materials containing no lead, and are also the glass compositions which satisfy all of conditions (a) to (d), that is, the condition (a) that the glass material can be baked at a proper temperature (1100° C. or below, for example), the condition (b) that the glass material withstands chemicals used in steps, the condition (c) that the glass material has a thermal expansion coefficient close to a thermal expansion coefficient of silicon (particularly, an average thermal expansion coefficient at a temperature of 50° C. to 500° C. being close to an average thermal expansion coefficient of silicon at a temperature of 50° C. to 500° C.), and the condition (d) that the glass material has excellent insulation property, and can suppress the generation of bubbles which may be generated from a boundary surface between a "layer made of glass composition for protecting a semiconductor junction" formed by electrophoresis and a semiconductor substrate (silicon) during a process of baking the layer made of glass composition for protecting a semiconductor junction whereby the deterioration of a reverse breakdown voltage characteristic of the semiconductor device can be suppressed.

Although the glass composition for protecting a semiconductor junction, the method of manufacturing a semiconductor device and the semiconductor device according to the present invention have been explained heretofore, the present invention is not limited to the above-mentioned embodiments, and various modifications of the present invention can be carried out including the following modifications, for example, without departing from the gist of the present invention.

(1) In the above-mentioned embodiment 3, in the second step, the glass layer is formed such that the glass layer directly covers the pn junction exposure portion in the inside of the trench. However, the present invention is not limited to such a constitution. For example, an insulation film may be formed on the pn junction exposure portion in the inside of the trench and, thereafter, a glass layer may be formed such that the glass layer covers the pn junction exposure portion with the insulation film interposed therebetween.

(2) In the above-mentioned embodiment 4, in the second step, the glass layer is formed such that the glass layer directly covers the pn junction exposure portion on the surface of the semiconductor substrate. However, the present invention is not limited to such a constitution. For example, an insulation film may be formed on the pn junction exposure portion on the surface of the semiconductor substrate and, thereafter, the glass layer may be formed such that the glass layer covers the pn junction exposure portion with the insulation film interposed therebetween.

(3) In the above-mentioned embodiments 3 and 4, the glass layer is formed using the glass composition for protecting a semiconductor junction according to the embodiment 1. However, the present invention is not limited to such a constitution. For example, the glass layer may be formed using the glass composition for protecting a semiconductor junction according to the embodiment 2. Still further, the glass layer may be formed using another glass composition for protecting a semiconductor junction which falls within a range of claim 1.

(4) In the above-mentioned embodiments 1 and 2, nickel oxide is used as "at least one metal oxide selected from a group consisting of nickel oxide, copper oxide and manganese oxide". However, the present invention is not limited to such a constitution. For example, copper oxide or manganese oxide may be used as "at least one metal oxide selected from a group consisting of nickel oxide, copper oxide and manganese oxide".

EXPLANATION OF SYMBOLS 100, 200, 900: semiconductor device
110, 910: $n^-$ type semiconductor substrate
112, 912: $p^+$ type diffusion layer
114, 914: $n^-$ type diffusion layer
116, 118, 916, 918: oxide film
120, 920: trench
124, 924: glass layer
126, 926: photoresist
130, 930: position where Ni plating electrode film is to be formed
132, 932: roughened surface region
134, 934: anode electrode
136, 936: cathode electrode
210: $n^+$ type semiconductor substrate
212: $n^-$ type epitaxial layer
214: $p^+$ type diffusion layer
216: $n^+$ type diffusion layer
215, 217: glass layer
218: anode electrode layer
220: cathode electrode layer
b: bubble

The invention claimed is:

1. A method of manufacturing a semiconductor device comprising:
   a first step of preparing a semiconductor element having a pn junction exposure portion where a pn junction is exposed; and
   a second step of depositing a glass layer such that the deposited glass layer covers the pn junction exposure portion, wherein
   in the second step, the deposited glass layer is formed of a glass composition for protecting a semiconductor junction, which is made of fine glass particles prepared from a material in a molten state obtained by melting a raw material mixture which contains at least $SiO_2$, $Al_2O_3$, MO, and nickel oxide, and substantially contains none of Pb, P, As, Sb, Li, Na and K; and where M corresponds to an alkaline earth metal.

2. The method of manufacturing a semiconductor device according to claim 1, wherein the first step comprises: a step of preparing a semiconductor substrate having a pn junction arranged parallel to a main surface of the semiconductor substrate; and a step of forming a trench having a depth which goes beyond the pn junction as measured from one surface of the semiconductor substrate thus forming the pn junction exposure portion in the inside of the trench, and the second step comprises a step of depositing the glass layer such that the glass layer covers the pn junction exposure portion in the inside of the trench.

3. The method of manufacturing a semiconductor device according to claim 2, wherein the second step comprises a step of depositing the glass layer such that the glass layer directly contacts the pn junction exposure portion in the inside of the trench.

4. The method of manufacturing a semiconductor device according to claim 1, wherein the first step comprises a step of forming the pn junction exposure portion on a surface of a semiconductor substrate, and the second step comprises a step of depositing the glass layer such that the glass layer covers the pn junction exposure portion on the surface of the semiconductor substrate.

5. The method of manufacturing a semiconductor device according to claim 4, wherein the second step comprises a step of depositing the glass layer such that the glass layer directly contacts the pn junction exposure portion on the surface of the semiconductor substrate.

6. The method of manufacturing a semiconductor device according to claim 1, wherein the glass composition for protecting a semiconductor junction also contains CaO and MgO, and is set such that the content of $SiO_2$ is set to a value which falls within a range of 53 mol % to 73 mol %, the content of $Al_2O_3$ is set to a value which falls within a range of 11 mol % to 21 mol %, a content of CaO is set to a value which falls within a range of 3 mol % to 9 mol %, further comprising a content of MgO which is set to a value which falls within a range of 11 mol % to 21 mol %, and the content of nickel oxide is set to a value which falls within a range of 0.01 mol % to 3 mol %.

7. The method of manufacturing the semiconductor device according to claim 1, wherein the glass composition for protecting a semiconductor junction also contains CaO, ZnO and $B_2O_3$ and is set such that the content of $SiO_2$ is set to a value which falls within a range of 32 mol % to 48 mol %, the content of $Al_2O_3$ is set to a value which falls within a range of 9 mol % to 13 mol %, a content of CaO is set to a value which falls within a range of 15 mol % to 23 mol %, further comprising a content of ZnO which is set to a value which falls within a range of 18 mol % to 28 mol %, further comprising a content of $B_2O_3$ which is set to a value which falls within a range of 3 mol % to 10 mol %, and the content of nickel oxide is set to a value which falls within a range of 0.01 mol % to 3 mol %.

\* \* \* \* \*